United States Patent
Moessner et al.

(10) Patent No.: US 9,437,803 B2
(45) Date of Patent: Sep. 6, 2016

(54) PIEZOELECTRIC ACTUATOR

(71) Applicants: Michael Moessner, Bretten (DE); Michael Kleindl, Schwieberdingen (DE)

(72) Inventors: Michael Moessner, Bretten (DE); Michael Kleindl, Schwieberdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 393 days.

(21) Appl. No.: 13/972,105

(22) Filed: Aug. 21, 2013

(65) Prior Publication Data

US 2014/0062264 A1 Mar. 6, 2014

(30) Foreign Application Priority Data

Sep. 6, 2012 (DE) .................. 10 2012 215 774

(51) Int. Cl.
*H01L 41/09* (2006.01)
*H01L 41/047* (2006.01)

(52) U.S. Cl.
CPC .................. *H01L 41/0475* (2013.01)

(58) Field of Classification Search
USPC .............. 310/323.01–323.19, 328, 354, 366
See application file for complete search history.

(56) References Cited

U.S. PATENT DOCUMENTS

| | | | | |
|---|---|---|---|---|
| 5,925,970 A | * | 7/1999 | Unami et al. | 310/328 |
| 7,804,230 B2 | * | 9/2010 | Redding et al. | 310/348 |
| 7,821,184 B2 | * | 10/2010 | Kaspar et al. | 310/366 |
| 2004/0026755 A1 | * | 2/2004 | Kim | 257/414 |
| 2005/0182448 A1 | * | 8/2005 | Ohmayer et al. | 607/2 |
| 2006/0186767 A1 | * | 8/2006 | Redding et al. | 310/365 |
| 2007/0040480 A1 | * | 2/2007 | Schurz et al. | 310/366 |
| 2009/0066192 A1 | * | 3/2009 | Taki et al. | 310/354 |
| 2013/0033154 A1 | * | 2/2013 | Sakuratani et al. | 310/366 |
| 2013/0107422 A1 | * | 5/2013 | Lee et al. | 361/321.2 |
| 2013/0162107 A1 | * | 6/2013 | Setoguchi | 310/355 |

FOREIGN PATENT DOCUMENTS

DE    10 2009 026 532 A1    12/2010

\* cited by examiner

*Primary Examiner* — Thomas Dougherty
(74) *Attorney, Agent, or Firm* — Norton Rose Fulbright US LLP

(57) ABSTRACT

A piezoelectric actuator, in particular for injectors in internal combustion engines, is provided which includes a piezoelectric module including a ceramic body and two end pieces which clamp the ceramic body axially in place, and an electrical connecting element which is secured on the piezoelectric module and which includes two contact plates leading to the ceramic body. To increase the robustness of the connecting element and to avoid fractures in the contact plates under high vibrational stresses, the contact plates are designed as one-piece metal stampings including at least partially embossed stamped edges.

12 Claims, 3 Drawing Sheets a)  b)

PIEZOELECTRIC ACTUATOR

FIELD OF THE INVENTION

The present invention is directed to a piezoelectric actuator, in particular for injectors in internal combustion engines.

BACKGROUND

A known injector valve (DE 10 2009 026 532 A1) includes a piezoelectric actuator for activating a valve needle, which cooperates with a valve seat to control a valve opening. The actuator includes a piezoelectric module having a ceramic body, which is clamped axially in place with the aid of a Bourdon spring between two end pieces and which is made up of a plurality of adjoining piezoelectric elements, and an electrical connecting element having two contact plates via which the piezoelectric module is connectable to an electrical connector plug secured to the side of the valve housing.

SUMMARY

An advantage of a piezoelectric actuator according to example embodiments of the present invention the present invention is that a connecting element may be cost-effectively produced by stamping the contact plates out of a sheet metal blank. The stamping process can produce stamped edges that include a large, smoothly cut portion and also a smaller, fractional portion which reveals cracks that result in fractures in the contact plates when the piezoelectric actuator is under high vibrational stress. With at least partial embossing of the stamped edges according to example embodiments of the present invention, the rough cut in the fractional portion of the stamped edges is compensated by the introduction of inherent compressive stresses and roundings, and thus the robustness of the contact plates against fractures occurring under vibrational stress is increased significantly.

According to one advantageous example embodiment of the present invention, the contact plates include metal sections which are variously formed and the embossed stamped edges are present at least partially in selected metal sections. By restricting the embossing of the stamped edges to metal sections which are particularly subject to vibrational stress due to their geometric shape and location in the connecting element, it is possible to reduce the manufacturing time, manufacturing costs and tooling costs.

According to one advantageous example embodiment of the present invention, the transition from sections including embossed stamped edges to sections without any embossed stamped edges is designed with a curvature radius. The radii-shaped transition between embossed and non-embossed sections of the stamped edges reduces the risk of fracture as a result of the notch effect.

According to one advantageous example embodiment of the present invention, each contact plate includes a contact section, a carrier section, a connecting section, and a yoke section projecting perpendicularly from the carrier section. The stamped edges are situated in the carrier and yoke sections at least in the zone of the yoke section that branches off from the carrier section. The yoke section includes a long hole with a central axis that extends at a right angle to the carrier section, is folded by 180° about a center line parallel to the carrier section, and is rotated by 90° about the axis of the long hole to form a weld yoke. Each contact plate is bent in such a way that the carrier section is U-shaped, including a long leg and a short leg and a cross web that links the legs, with both the contact section at the end of the long leg and the connecting section at the end of the short leg projecting at right angles therefrom, and the yoke section near the long leg projecting from the cross web, away from the contact section. The connecting element includes a plastic body including a hollow cylinder and a bearing flange and which is spray-molded onto the bent contact plates in such a way that the connecting sections, with the exception of their open ends, are encased, the shorter legs of the carrier section being embedded in the bearing flange and the long legs of the carrier section being spaced apart on diametrically opposite sides of the hollow cylinder from the bearing flange, extending parallel to the latter. The terminal leads of a resistor are accommodated and welded in the weld yokes of both contact plates. As a result of such bending of the contact plates, spray-molding of the plastic body, and securing of the resistor in the weld yokes, the zone of the carrier section around the branched yoke section as well as the yoke section branching off from the carrier section are subject to the most extreme mechanical stresses, so that embossing of the stamped edges in this zone of the carrier section and yoke section takes priority.

According to one advantageous example embodiment of the present invention, the boundary edges of the long hole in the yoke section are embossed stamped edges. Embossing the stamped edges of the long hole averts the risk of the terminal leads of the resistor breaking under extreme vibrational stress.

The present invention is described in greater detail below with reference to a specific exemplary embodiment shown in the drawings.

DETAILED DESCRIPTION

Figure 1:
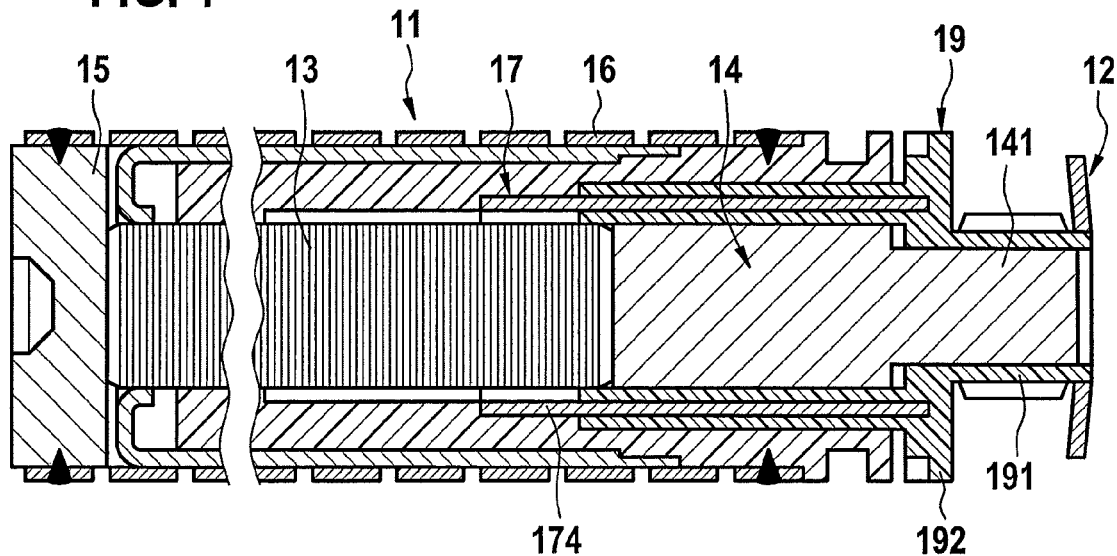
FIG. 1 shows a longitudinal section of a piezoelectric actuator including a piezoelectric module and a connecting element, according to an example embodiment of the present invention.

FIG. 1 shows a piezoelectric actuator in a longitudinal section, which piezoelectric actuator includes a piezoelectric module 11 and a connecting element 12 which is fixedly attached to piezoelectric module 11. Piezoelectric module 11 includes in a known manner a ceramic body 13 and two end pieces 14, 15 which clamp ceramic body 13 axially in place. Ceramic body 13 is usually made up of a plurality of axially adjoining piezoelectric ceramic elements. The pressure of end pieces 14, 15 acting on ceramic body 13 is generated by a Bourdon spring 16 connected to both end pieces 14, 15. Connecting element 12 rests on an extension 141 projecting in one piece from end piece 14 and is secured in end piece 14.

Figure 2:
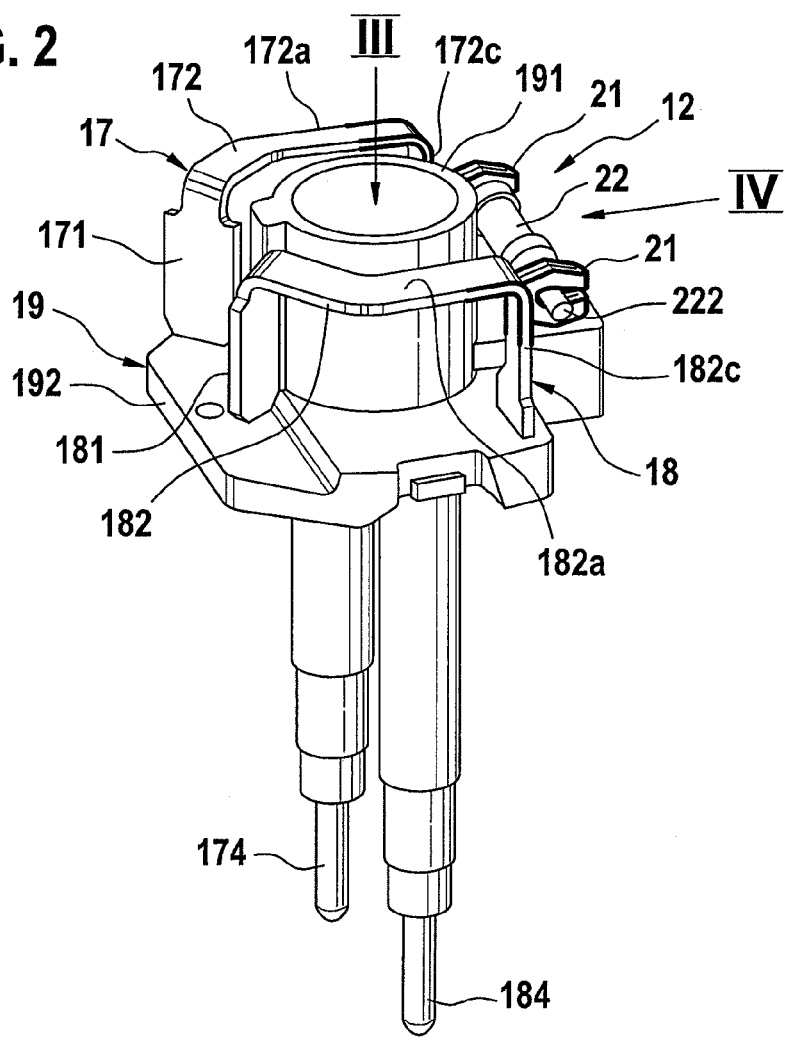
FIG. 2 shows a perspective view of the connecting element of the actuator in FIG. 1, according to an example embodiment of the present invention.
Figure 3:
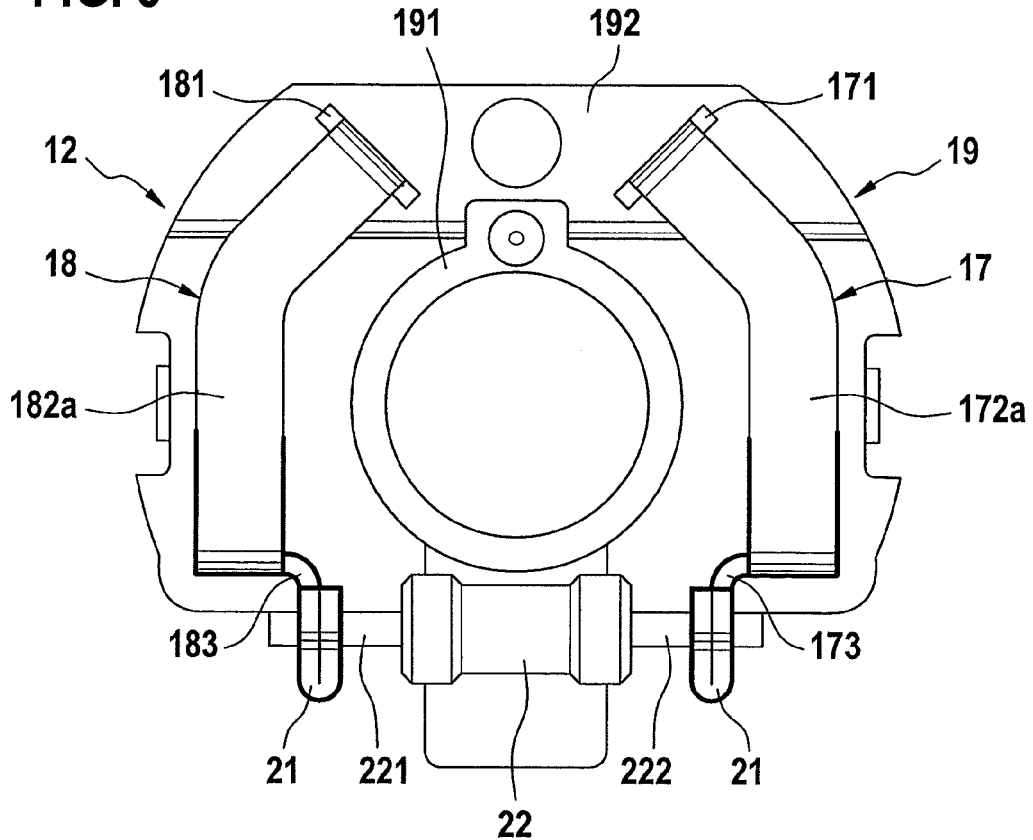
FIG. 3 shows a top view of the connecting element in the direction of arrow III in FIG. 2, according to an example embodiment of the present invention.
Figure 5:
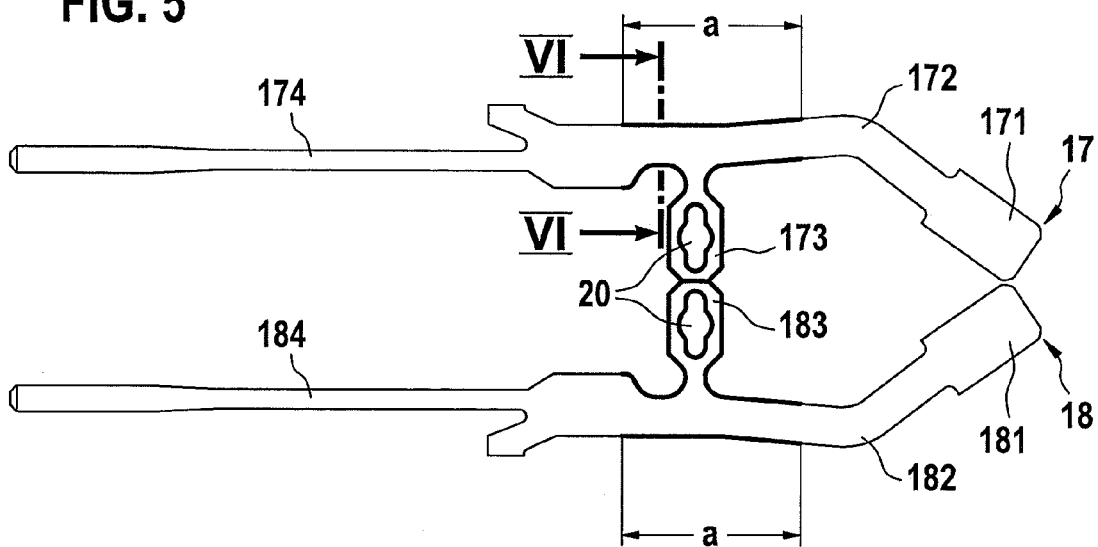
FIG. 5 shows a top view of two contact plates of the connecting element in FIG. 2 stamped out of a sheet metal blank, according to an example embodiment of the present invention.
Figure 6:
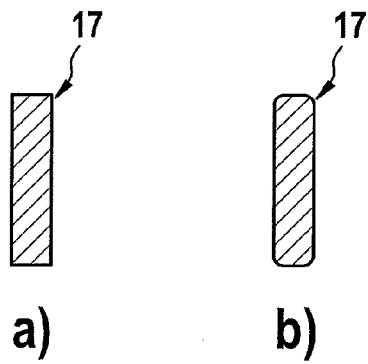
FIG. 6 shows a section along line VI-VI in FIG. 5, according to an example embodiment of the present invention.

Connecting element 12 shown in perspective in FIG. 2 and in a top view in FIG. 3 includes two contact plates 17, 18 leading to piezoelectric module 11 and a plastic body 19 spray-molded onto contact plates 17, 18. Contact plates 17, 18 are one-piece, metal stampings stamped out of a sheet metal blank, as shown in FIG. 5. Contact plates 17, 18 bent in a manner further described below, as shown for contact plate 17 in FIG. 7, and plastic body 19 is spray-molded to both bent contact plates 17, 18, resulting in the formation of a hollow cylinder 191 and a bearing flange 192 for securing contact plates 17, 18. Contact plates 17, 18 produced by this stamping process include stamped edges made up of a larger, smooth cut portion and a smaller, fractional portion. The fractional portion can include a rough cut and, therefore, cracks, which may cause fractures in contact plates 17, 18 when connecting element 12 is under high mechanical stress, for example, vibrational stress of the actuator. To increase the robustness of contact plates 17, 18, the stamped edges are partially embossed. For this purpose, after the stamping process, an embossing die partially encloses contact plates 17, 18 and, via rounded edges, deforms the stamped edges, thereby introducing an inherent stress. FIG. 6 shows a cross section of contact plate 17 along intersection line VI-VI, specifically, in FIG. 6a before and in FIG. 6b after embossing of the stamped edges. The rounding of the previously sharp-edged cross-section is clearly visible.

As is apparent in FIG. 5, contact plates 17, 18 include metal sections that are variously formed. The embossed stamped edges are present at least in part in selected metal sections. A section 'a' with embossed stamped edges in both contact plates 17, 18 is outlined in FIG. 5. In this section, the lines symbolizing the embossed stamped edges are in bold. The transition from those sections including embossed stamped edges to sections without embossed stamped edges extending on either side is designed with a curvature radius.

Each contact plate 17, 18 includes a contact section 171, 181, a carrier section 172, 182, a yoke section 173, 183 projecting perpendicularly from carrier section 172, 182 and a connecting section 174, 184. As shown in FIG. 5, the embossed stamped edges in carrier and yoke sections 172, 182 and 173, 183 are situated in the zone of yoke section 173, 183 which branches off from carrier section 172, 182. Yoke section 173, 183 includes a long hole 20 whose central axis runs at a right angle to carrier section 172, 182. The boundary edges of the long hole are also embossed stamped edges and are rendered in FIG. 5 in bold. Yoke sections 173 and 183 are folded by 180° about a center line parallel to carrier section 172, 182 and rotated by 90° about the long hole axis. This creates a weld yoke 21 on each contact plate 174, 184, as is shown for contact plate 17 in FIG. 7. Each of yoke welds 21 is used to accommodate a terminal lead 221, 222 of a resistor 22, as may be seen in FIGS. 2, 3 and 4. Terminal leads 221, 222 are welded in the weld yokes 21.

Figure 7:
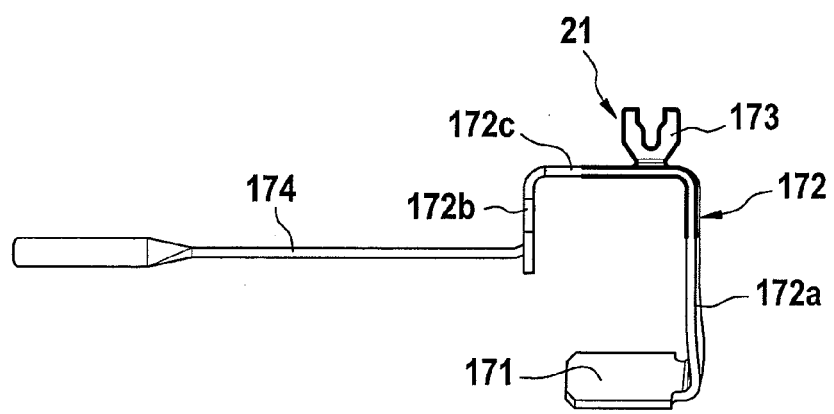
FIG. 7 shows a side view of one of the two contact plates in FIG. 4 after having been bent according to installation requirements, according to an example embodiment of the present invention.

Each contact plate 17 and 18, as shown for contact plate 17 in FIG. 7, is bent in such a way that carrier section 172 is U-shaped, including a long leg 172a, a short leg 172b and a cross web 172c that links legs 172a and 172b, with both carrier section 171 at the end of long leg 172a and connecting section 174 at the end of short leg 172b projecting at right angles from long leg 172a and short leg 172b, respectively, and yoke section 173 near long leg 172a projecting from cross web 172c, away from contact section 171. Legs 182a and cross web 182c created by the same bending of contact plate 18 may be seen in FIGS. 2, 3 and 4. Plastic body 19 is spray-molded to both contact plates 17, 18 bent in this manner in such a way that connecting sections 174, 184, with the exception of their open ends, are encased, the short legs 172b of the carrier sections 172, 182 being embedded in bearing flange 192 and long legs 172a, 182a of carrier sections 172, 182 extending on diametrically opposite sides of hollow cylinder 191 at a distance from and parallel to bearing flange 192 (FIG. 2).

Figure 4:
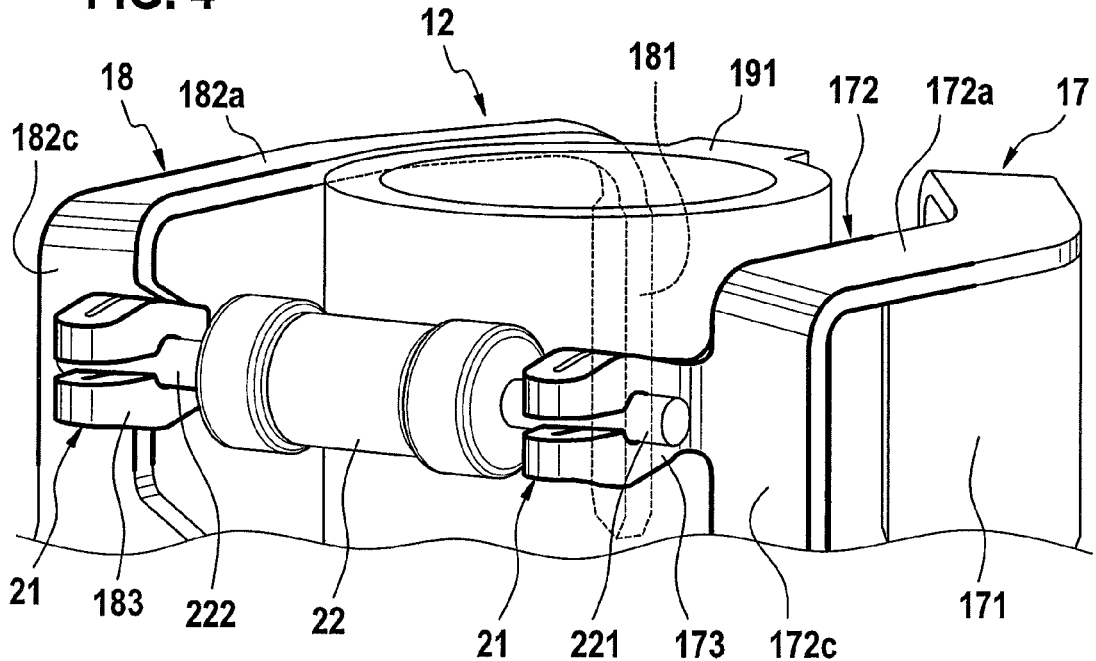
FIG. 4 shows a partial section of an enlarged view of the connecting element in the direction of arrow IV in FIG. 2, according to an example embodiment of the present invention.

In the partial, enlarged perspective view of connecting element 12 shown in FIG. 4, the embossed stamped segments in carrier section 172, 182 and in yoke section 173, 183 are in turn rendered visible by bolded lines. The inner edges of weld yokes 21 also include these embossed stamped edges.

To connect piezoelectric module 11 and connecting element 12, connecting element 12 is fitted with hollow cylinder 191 onto extension 141 on end piece 14, the encased connecting sections 174, 184 of both contact plates 17, 18 being routed through end piece 14 or past end piece 14 (FIG. 1). Both open ends of connecting sections 174, 184 make contact with a contact screen or contact grid attached by soldering or resistance welding, for example, to ceramic body 13. Upon installation of the actuator in a valve, contact sections 171, 181 are connected electrically conductively to a plug connection on the side of the valve. Resistor 22 inserted in weld yokes 21 is a high resistance discharge resistor, the size of which is a function of the capacitance of piezoelectric module 11. It prevents a voltage potential from being applied at the plug connection of the valve which is not permitted for safety reasons.

What is claimed is:
1. A piezoelectric actuator comprising:
   a piezoelectric module that includes a ceramic body and two end pieces which clamp the ceramic body axially in place; and
   an electrical connecting element secured to one of the end pieces, the electrical connecting element including two contact plates, each of the two contact plates having two connecting sections which have open ends that are guided to the ceramic body, wherein the contact plates are one-piece, metal stampings including at least partially embossed stamped edges.
2. The actuator of claim 1, wherein the contact plates each includes different metal sections and the embossed stamped edges are present at least in part in a subset of the metal sections.
3. The actuator of claim 2, wherein a transition from the sections including embossed stamped edges to sections without stamped edges is designed with a curvature radius.
4. The actuator of claim 2, wherein, with respect to each of the contact plates:
   the respective contact plate includes a contact section, a carrier section, a yoke section projecting perpendicularly from the carrier section, and the connecting section; and
   the embossed stamped edges in the carrier and yoke sections of the respective contactplate are situated at least in a zone where the yoke section branches off from the carrier section.

5. The actuator of claim 4, wherein the yoke section includes a long hole, boundary edges of which are embossed stamped edges.

6. The actuator of claim 5, wherein a central axis of the long hole initially extends at a right angle to a portion of the carrier section to which the yoke section is attached, the yoke section being folded by 180° about a center line that is parallel to a direction in which the portion of the carrier section to which the yoke section is attached longitudinally extends, and the yoke section being rotated such that the central axis shifts by 90°.

7. The actuator of claim 4, wherein, with respect to each of the contact plates:
   the carrier section is bent into a U-shape, including a long leg, a short leg, and a cross web that links the long and short legs;
   the contact section projects at a right angle from an end of the long leg;
   the connecting section projects at a right angle from an end of the short leg; and
   the yoke section projects from the cross web near the long leg and away from the contact section.

8. The actuator of claim 7, wherein:
   the connecting element includes a plastic body that includes a hollow cylinder and a bearing flange;
   the plastic body is spray-molded to the bent contact plates in such a way that the connecting sections, with the exception of respective ends of the connecting sections, are encased;
   the short legs of the carrier sections are embedded in the bearing flange; and
   the long legs of the carrier sections extend on diametrically opposite sides of the hollow cylinder at a distance from, and parallel to, the bearing flange.

9. The actuator of claim 8, wherein terminal leads of a resistor are accommodated and welded in the welding yokes of the contact plates.

10. The actuator of claim 8, wherein:
    the hollow cylinder is fitted onto an extension that projects from the end piece to which the electrical connecting element is secured;
    the encased connecting sections of the contact plates are routed at least one of through and past the end piece.

11. The actuator of claim 10, wherein the extension and the end piece to which the electrical connecting element is secured are formed as a single integral element.

12. The actuator of claim 1, wherein the actuator is adapted for an injector in an internal combustion engine.

* * * * *